(12) United States Patent
Wang et al.

(10) Patent No.: US 11,527,599 B2
(45) Date of Patent: Dec. 13, 2022

(54) ARRAY SUBSTRATE, METHOD FOR FABRICATING THE SAME DISPLAY PANEL, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Haitao Wang, Beijing (CN); Qinghe Wang, Beijing (CN); Jun Wang, Beijing (CN); Guangyao Li, Beijing (CN); Yang Zhang, Beijing (CN); Jun Liu, Beijing (CN); Dongfang Wang, Beijing (CN)

(73) Assignees: Hefei Xinsheng Optoelectronics Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 70 days.

(21) Appl. No.: 16/665,410

(22) Filed: Oct. 28, 2019

(65) Prior Publication Data

US 2020/0273939 A1 Aug. 27, 2020

(30) Foreign Application Priority Data

Feb. 27, 2019 (CN) .......................... 201910145454.0

(51) Int. Cl.
*H01L 27/32* (2006.01)
*G02F 1/1362* (2006.01)

(52) U.S. Cl.
CPC .... *H01L 27/3276* (2013.01); *G02F 1/136286* (2013.01); *G02F 1/136295* (2021.01); *H01L 2227/323* (2013.01)

(58) Field of Classification Search
CPC ........... H01L 27/3276; H01L 2227/323; H01L 51/0096; H01L 2251/105; G02F 1/1362;
(Continued)

(56) References Cited

U.S. PATENT DOCUMENTS 7,586,259 B2 * 9/2009 Kwak ................. H01L 51/5246
 313/506
7,948,177 B2 * 5/2011 Kwak ................. H01L 27/3288
 313/506
(Continued)

FOREIGN PATENT DOCUMENTS

CN 101447490 A 6/2009
CN 101561602 A 10/2009
(Continued)

OTHER PUBLICATIONS

English Translation of CN101561602.*
Office Action for corresponding Chinese Application 201910145454.0 dated Jul. 3, 2020.

*Primary Examiner* — Mary A Wilczewski
(74) *Attorney, Agent, or Firm* — ArentFox Schiff LLP; Michael Fainberg

(57) ABSTRACT

Disclosed are an array substrate, a method for fabricating the same, a display panel, and a display device, and the array substrate includes: an underlying substrate, and gate lines and data lines located on the underlying substrate, and intersecting with each other, a layer where the gate lines are located is between a layer where the data lines are located, and the underlying substrate; and the array substrate further includes a buffer layer located between the underlying substrate and the layer where the gate lines are located; and the buffer layer includes a plurality of through-holes, where orthographical projections of the through-holes onto the
(Continued)

underlying substrate cover orthographical projections of the areas where the gate lines intersect with the data lines, onto the underlying substrate.

8 Claims, 8 Drawing Sheets

(58) Field of Classification Search
CPC ......... G02F 1/136286; G02F 1/136295; Y02E 10/549; Y02P 70/50
See application file for complete search history.

(56) References Cited

U.S. PATENT DOCUMENTS

| | | | | |
|---|---|---|---|---|
| 8,138,075 | B1* | 3/2012 | Eberlein | G02F 1/1368 438/587 |
| 2003/0038903 | A1* | 2/2003 | Kobayashi | H01L 29/78633 349/100 |
| 2004/0075783 | A1* | 4/2004 | Lee | H01L 27/1237 349/43 |
| 2006/0115983 | A1* | 6/2006 | Fujii | H01L 21/288 257/E21.174 |
| 2006/0132411 | A1 | 6/2006 | Kim et al. | |
| 2007/0176551 | A1* | 8/2007 | Kwak | H01L 27/3276 313/506 |
| 2009/0184326 | A1 | 7/2009 | Lee et al. | |
| 2010/0261322 | A1 | 10/2010 | Kim et al. | |
| 2014/0138637 | A1* | 5/2014 | Yang | H01L 27/1218 257/40 |
| 2016/0357081 | A1 | 12/2016 | Li | |
| 2019/0058140 | A1* | 2/2019 | Shi | H01L 27/3262 |
| 2020/0201108 | A1 | 6/2020 | Li et al. | |
| 2020/0273939 | A1* | 8/2020 | Wang | H01L 51/0096 |

FOREIGN PATENT DOCUMENTS

| | | | | |
|---|---|---|---|---|
| CN | 101561602 | * | 7/2011 | ........... G02F 1/1362 |
| CN | 104536207 | A | 4/2015 | |
| CN | 205881903 | U | 1/2017 | |
| CN | 107132687 | A | 9/2017 | |
| EP | 1 748 502 | * | 1/2007 | ............. H01L 51/00 |

* cited by examiner

ARRAY SUBSTRATE, METHOD FOR FABRICATING THE SAME DISPLAY PANEL, AND DISPLAY DEVICE

CROSS-REFERENCE TO RELATED APPLICATION

This application claims priority of Chinese Patent Application No. 201910145454.0, filed on Feb. 27, 2019, which is hereby incorporated by reference in its entirety.

FIELD

The present disclosure relates to the field of display technologies, and particularly to an array substrate, a method for fabricating the same, a display panel, and a display device.

BACKGROUND

In the existing flow of fabricating an array substrate, in order to prevent components on an underlying substrate from entering an active layer in a process of forming the active layer, which would otherwise have degraded the performance of the active layer, a buffer layer is arranged between the active layer and the underlying substrate.

SUMMARY

In a first aspect, some embodiments of the disclosure provide an array substrate including: an underlying substrate, and gate lines and data lines located on the underlying substrate, and intersecting with each other, a layer where the gate lines are located is between a layer where the data lines are located, and the underlying substrate, wherein the array substrate further includes a buffer layer located between the underlying substrate and the layer where the gate lines are located; and the buffer layer includes a plurality of through-holes, wherein orthographical projections of the through-holes onto the underlying substrate cover orthographical projections of intersection areas where the gate lines intersect with the data lines, onto the underlying substrate.

In a possible implementation, in the array substrate above according to some embodiments of the disclosure, the array substrate further include filling sections located in the through-holes on sides of the gate lines away from the underlying substrate; and sides of the filling sections away from the underlying substrate are flush with a side of the buffer layer away from the underlying substrate.

In a possible implementation, in the array substrate above according to some embodiments of the disclosure, the array substrate further includes an interlayer dielectric layer located between the layer where the gate lines are located, and the layer where the data lines are located.

In a possible implementation, in the array substrate above according to some embodiments of the disclosure, the interlayer dielectric layer includes first grooves arranged corresponding to the through-holes, in the intersection areas, and the data lines are located in the first grooves; and the orthographical projections of the through-holes onto the underlying substrate cover orthographical projections of the first grooves onto the underlying substrate.

In a possible implementation, in the array substrate above according to some embodiments of the disclosure, area other than the intersection areas the array substrate further includes active layers located between the buffer layer and the layer where the gate lines are located.

In a possible implementation, in the array substrate above according to some embodiments of the disclosure, the interlayer dielectric layer includes second grooves arranged corresponding to the active layers; and source and drain electrodes arranged at a layer same as the layer where the data lines are located in the second grooves.

In a possible implementation, in the array substrate above according to some embodiments of the disclosure, the interlayer dielectric layer is made of silicon dioxide, silicon nitride, a macromolecule material, or gas gel.

In a second aspect, some embodiments of the disclosure further provide a method for fabricating an array substrate, the method including:

preparing the underlying substrate;

forming the buffer layer on the underlying substrate;

forming the through-holes at the buffer layer in the preset intersection areas where the gate lines intersect with the data lines; and forming the gate lines and the data lines on the buffer layer.

In a possible implementation, in the method above for fabricating an array substrate above according to some embodiments of the disclosure, forming the through-holes at the buffer layer in the preset intersection areas where the gate lines intersect with the data lines includes:

forming the through-holes at the buffer layer through exposure and development using a first mask.

In a possible implementation, in the method above for fabricating an array substrate above according to some embodiments of the disclosure, the method further includes:

forming filling sections to fill the through-holes, using a second mask after the gate lines are formed.

In a possible implementation, in the method above for fabricating an array substrate above according to some embodiments of the disclosure, the first mask and the second mask are same.

In a possible implementation, in the method above for fabricating an array substrate above according to the embodiments of the disclosure, the method further includes:

forming an interlayer dielectric layer on a side of the layer where the gate lines are located, away from the underlying substrate; and forming first grooves corresponding to the through-holes, and second grooves corresponding to active layers, on the interlayer dielectric layer.

In a possible implementation, in the method above for fabricating an array substrate above according to some embodiments of the disclosure, the interlayer dielectric layer is made of silicon dioxide, silicon nitride, a macromolecule material, or gas gel.

In a third aspect, some embodiments of the disclosure further provide a display panel including the array substrate according to any one of the embodiments of the disclosure in the first aspect.

In a fourth aspect, some embodiment of the disclosure further provide a display device including the display panel according to the embodiment of the disclosure in the third aspect.

DETAILED DESCRIPTION OF THE EMBODIMENTS

Figure 1:
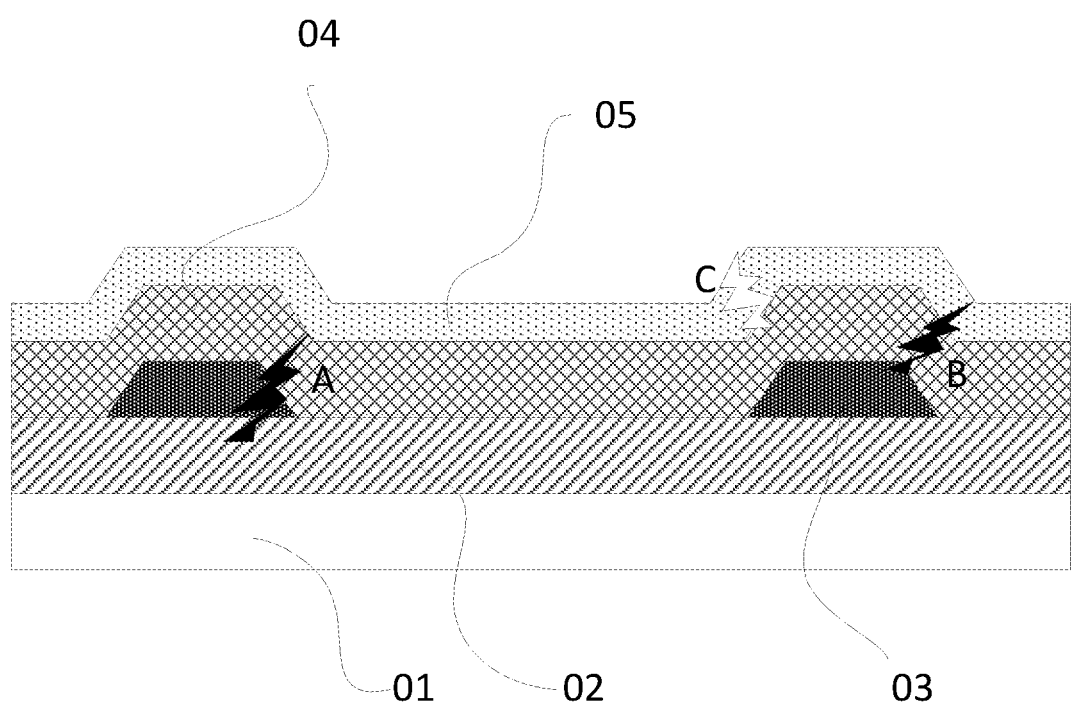
FIG. 1 is a schematic structural diagram of an array substrate in the related art.

As illustrated in FIG. 1, the array substrate in the related art includes an underlying substrate 01, and a buffer layer 02 located on the underlying substrate 01, where while the buffer layer 02 is being formed, foreign substances A are deposited into the area where a gate line 03 intersects with a data line 05, and penetrates an interlayer dielectric layer 04 so that the gate line 03 is short-circuited with the data line 05, thus hindering an image from being displayed orthographically on a display panel including the array substrate.

In view of the problem above of the array substrate in the related art, the embodiments of the disclosure provide an array substrate, a method for fabricating the same, a display panel, and a display device. In order to make the objects, technical solutions, and advantages of the disclosure more apparent, the disclosure will be described below in further details with reference to the drawings. Apparently the embodiments to be described are only a part but not all of the embodiments of the disclosure. Based upon the embodiments here of the disclosure, all the other embodiments which can occur to those ordinarily skilled in the art without any inventive effort shall come into the scope of the disclosure as claimed.

The shapes and sizes of respective components in the drawings are not intended to reflect any real proportion, but only intended to illustrate the disclosure of the disclosure.

Figure 2:
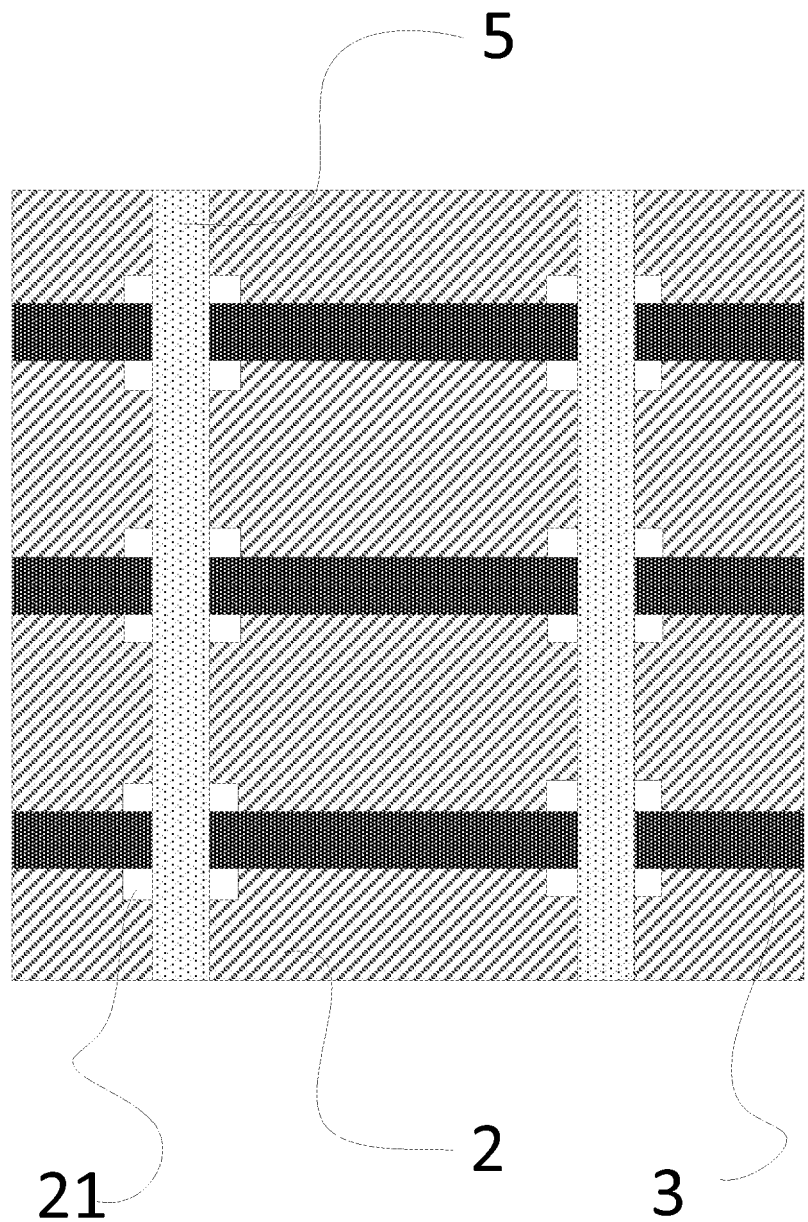
FIG. 2 is a schematic structural diagram of an array substrate according to an embodiment of the disclosure in a plan view.
Figure 3:
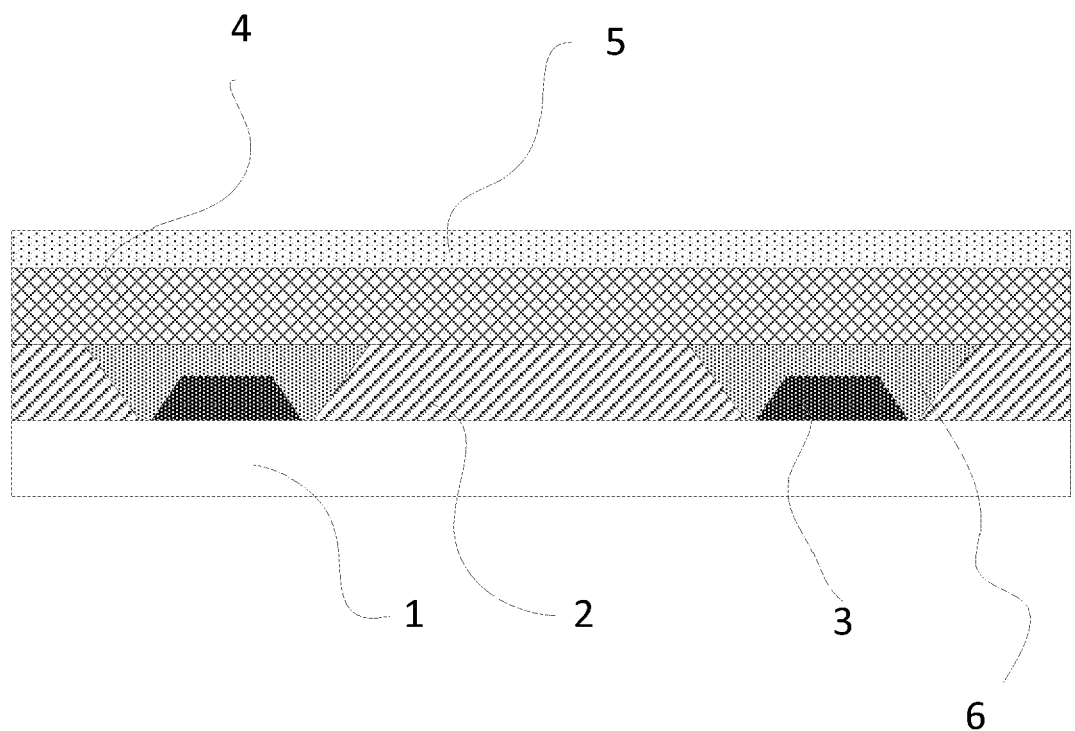
FIG. 3 is a first schematic structural diagram of the array substrate according to the embodiment of the disclosure in a sectional view along the extension direction of data lines.

As illustrated in FIG. 2 and FIG. 3, an array substrate according to an embodiment of the disclosure includes an underlying substrate 1, and gate lines 3 and data lines 5 located on the underlying substrate 1, and arranged intersecting with each other, a layer where the gate lines 3 are located is between a layer where the data lines 5 are located, and the underlying substrate; and the array substrate further includes a buffer layer located between the underlying substrate and the layer where the gate lines 3 are located.

The buffer layer 2 includes a plurality of through-holes 21, where orthographical projections of the through-holes 21 onto the underlying substrate 1 cover orthographical projections of the areas where the gate lines 3 intersect with the data lines 5, onto the underlying substrate 1.

Optionally, in the array substrate according to some embodiments of the disclosure, the through-holes are arranged at the buffer layer in the areas where the data lines intersect with the gate lines so that the foreign substances at the buffer layer in the intersection areas can be removed to thereby avoid the foreign substances from penetrating an insulation layer between the gate lines and the data lines, which would otherwise have short-circuited the gate lines with the data lines.

Optionally, in the array substrate according to some embodiments of the disclosure, as illustrated in FIG. 2 and FIG. 3, the array substrate further includes filling sections 6 located in the through-holes 21 on the sides of the gate lines 3 away from the underlying substrate 1.

The sides of the filling sections 6 away from the underlying substrate 1 are flush with the side of the buffer layer 2 away from the underlying substrate 1.

Optionally, in the array substrate according to some embodiments of the disclosure, the filling sections are arranged so that the data lines can be formed on the same plane to thereby avoid the problem in the related art as illustrated in FIG. 1 that the data line 05 may be easily broken at the position C where it protrudes.

Optionally, in the array substrate according to some embodiments of the disclosure, as illustrated in FIG. 3, the array substrate further includes an interlayer dielectric layer 4 located between the layer where the gate lines 3 are located, and the layer where the data lines 5 are located.

Here the interlayer dielectric layer can be made of silicon dioxide, silicon nitride, a macromolecule material, gas gel, etc.

Figure 4:
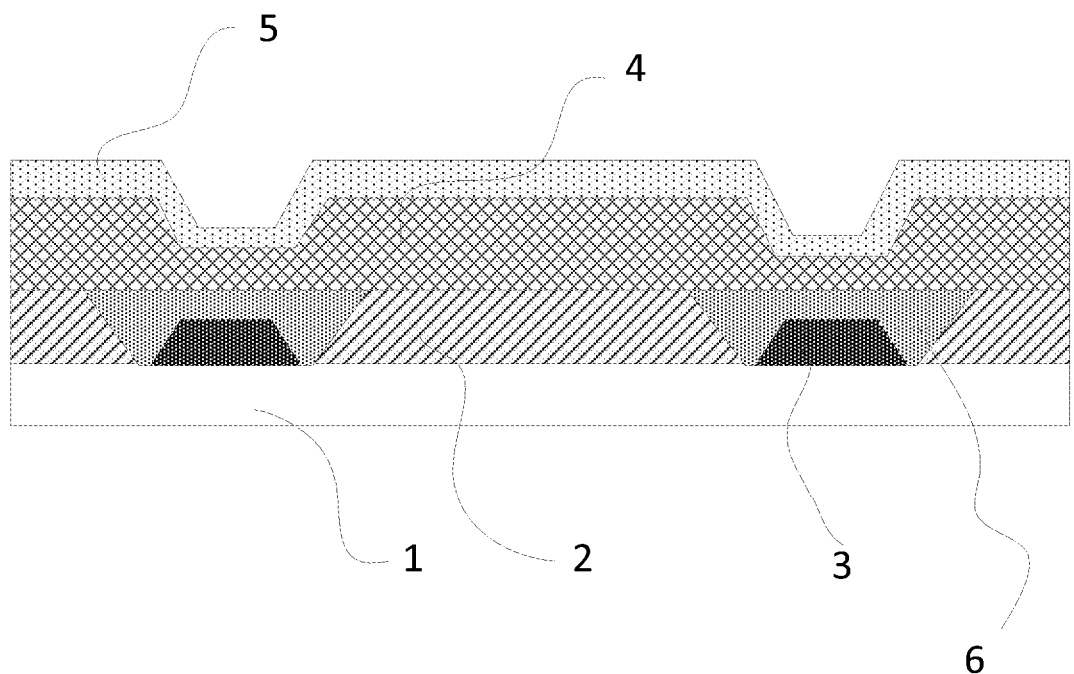
FIG. 4 is a first schematic structural diagram of the array substrate according to the embodiment of the disclosure in a sectional view along the extension direction of the data lines.

Optionally, in the array substrate according to some embodiments of the disclosure, as illustrated in FIG. 4, the interlayer dielectric layer 4 includes first grooves arranged corresponding to the through-holes, where the data lines 4 are located in the first grooves.

The orthographical projections of the through-holes onto the underlying substrate 1 cover orthographical projections of the first grooves onto the underlying substrate 1.

Optionally, in the array substrate according to some embodiments of the disclosure, in the related art as illustrated in FIG. 1, while the interlayer dielectric layer 4 is being formed, there may also be foreign substances B in the areas where the data lines 5 intersect with the gate lines 3, and the gate lines 3 may also be short-circuited with the data lines 5 due to the foreign substances B. In view of this, in the embodiment of the disclosure, the first grooves are arranged at the interlayer dielectric layer 4 in the intersection areas as illustrated in FIG. 4 so that the data lines and the gate lines can be avoided in effect from being short-circuited with each other in the intersection areas due to the foreign substances.

Optionally, in the array substrate according to some embodiments of the disclosure, the array substrate in other than the intersection areas further includes active layers located between the buffer layer and the layer where the gate lines are located.

Here source and drain electrodes arranged at the same layer as the data lines are electrically connected with the active layers.

Optionally, in the array substrate according to some embodiments of the disclosure, the interlayer dielectric layer includes second grooves arranged corresponding to the active layers.

The source and drain electrodes arranged at the same layer as the data lines are located in the second grooves.

Optionally, in the array substrate according to some embodiments of the disclosure, the second grooves are arranged so that the distances between the source and drain electrodes and the active layers can be shortened to thereby facilitate lapping of the source and drain electrodes with the active layers.

A flow of fabricating the array substrate structured as illustrated in FIG. 4 will be described below in details.

Figure 5A:
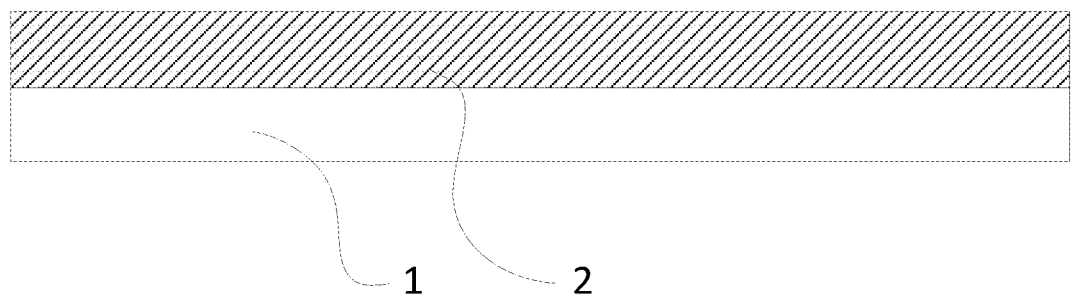
FIG. 5A to FIG. 5F are schematic structural diagrams of a flow chart of fabricating the array substrate according to an embodiment of the disclosure.

The first step is to prepare an underlying substrate 1, and to form a buffer layer 2 on the underlying substrate 1, as illustrated in FIG. 5A.

Figure 5B:
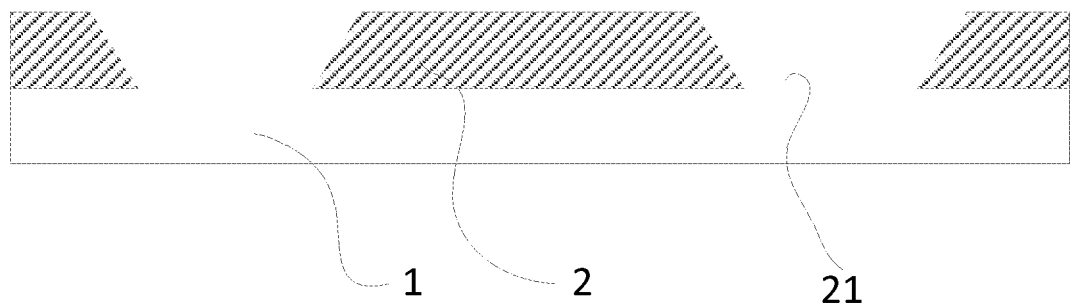

The second step is to expose and develop the buffer layer 2 using a first mask, and to form through-holes 21 in preset intersection areas, as illustrated in FIG. 5B.

It shall be noted that grooves can alternatively be formed at the buffer layer in the intersection areas, that is, the buffer layer is not etched through, but the buffer layer is so thin that it is difficult not to etch through the buffer layer.

The third step is to deposit active layers, to pattern the active layers, and to form gate insulation layers.

Figure 5C:
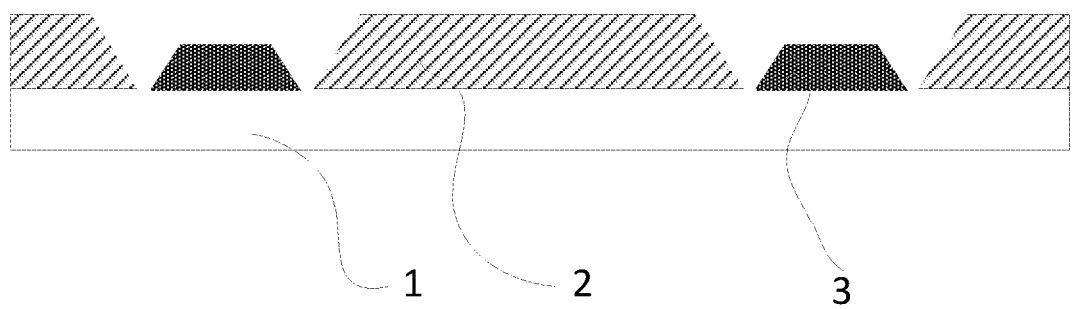

The fourth step is to deposit the layer where the gate lines are located, and to form a pattern of the gate lines 3 in exposure, development, and other processes, as illustrated in FIG. 5C.

The material of the layer where the gate lines are located can be copper or aluminum.

Figure 5D:
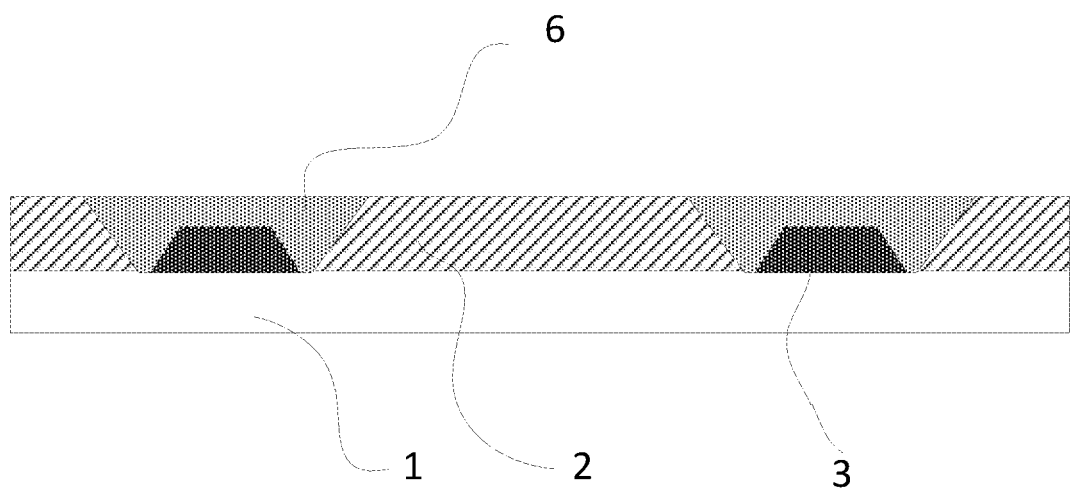

The fifth step is to form filling sections 6 in the areas where the through-holes are located, using a second mask, and to fill the through-holes after the gate lines 3 are formed, as illustrated in FIG. 5D, where the second mask can be the same mask as the first mask.

Figure 5E:
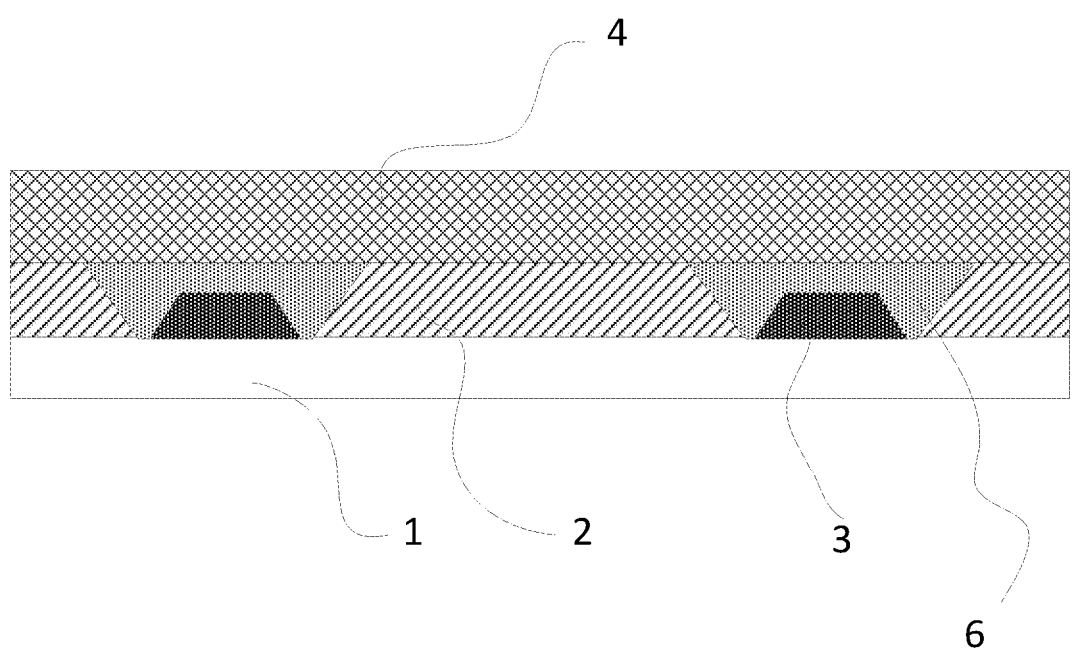

The sixth step is to form an interlayer dielectric layer 4 as illustrated in FIG. 5E.

Figure 5F:
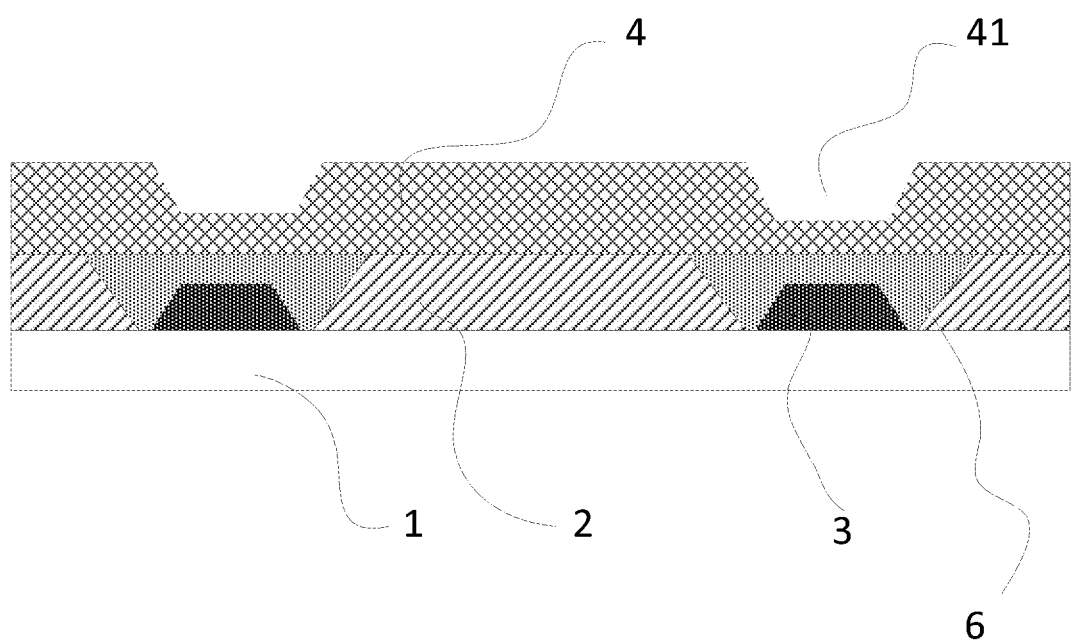

The seventh step is to form first grooves 41 corresponding to the through-holes, and second grooves corresponding to the active layers (the second grooves are not illustrated), at the interlayer dielectric layer 4 as illustrated in FIG. 5F.

The eighth step is to form data lines 5, and a pattern of source and drain electrodes on the interlayer dielectric layer 4 (the source and drain electrodes are not illustrated) as illustrated in FIG. 4.

Based upon the same inventive idea, some embodiments of the disclosure further provide a method for fabricating an array substrate, where the method includes the following steps:

preparing an underlying substrate;

forming a buffer layer on the underlying substrate;

forming through-holes at the buffer layer in preset areas where gate lines intersect with data lines; and forming the gate lines and the data lines on the buffer layer.

Optionally, in the method for fabricating an array substrate according to some embodiments of the disclosure, forming the through-holes at the buffer layer in the preset areas where the gate lines intersect with the data lines includes:

forming the through-holes at the buffer layer through exposure and development using a first mask.

Optionally, in the method for fabricating an array substrate according to some embodiments of the disclosure, the method further includes:

forming filling sections to fill the through-holes, using a second mask after the gate lines are formed.

Optionally, in the method for fabricating an array substrate according to some embodiments of the disclosure, the first mask is the same mask as the second mask.

Optionally, in the method for fabricating an array substrate according to some embodiments of the disclosure, the method further includes:

forming an interlayer dielectric layer on a layer where the gate lines are located, away from the underlying substrate; and forming first grooves corresponding to the through-holes, and second grooves corresponding to active layers, on the interlayer dielectric layer.

Based upon the same inventive idea, some embodiments of the disclosure further provide a display panel including the array substrate according to any one of embodiments above of the disclosure.

Figure 6:
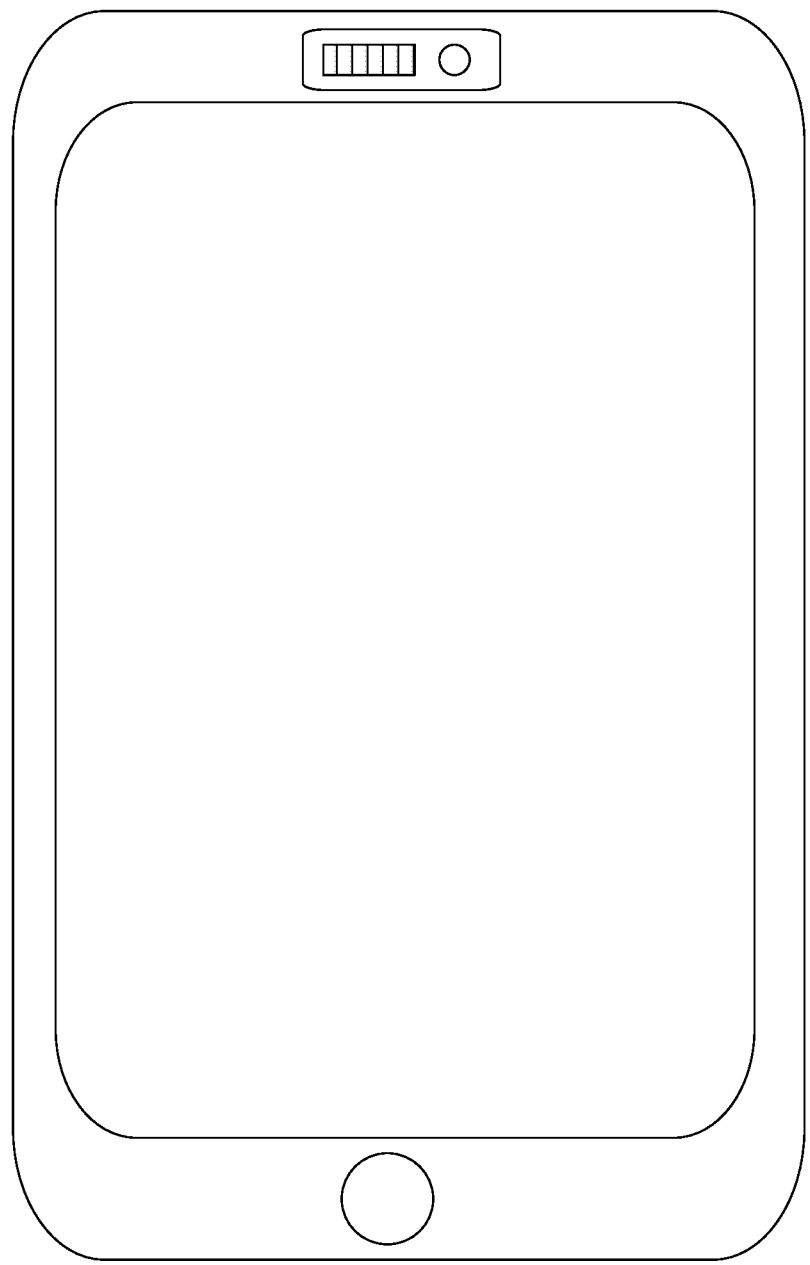
FIG. 6 is a schematic structural diagram of a display device according to an embodiment of the disclosure.

Based upon the same inventive idea, some embodiment of the disclosure further provide a display device as illustrated in FIG. 6, which includes the array panel according to any one of embodiments above of the disclosure.

Since the display panel and the display device address the problem under a similar principle to the array substrate above, reference can be made to the implementation of the array substrate above for implementations of the display panel and the display device, so a repeated description thereof will be omitted here.

Here the display panel is applicable to an organic light-emitting diode display, an inorganic light-emitting diode display, an Active matrix Organic Light-Emitting Diode (AMOLED) display, etc. The display device can be a mobile phone, a tablet computer, a TV set, a monitor, a notebook computer, a digital photo frame, a navigator, or any other product or component with a display function, although the embodiment of the disclosure will not be limited thereto.

In the array substrate, the method for fabricating the same, the display panel, and the display device according to the embodiments of the disclosure, the array substrate includes: an underlying substrate, and gate lines and data lines located on the underlying substrate, and arranged intersecting with each other, where a layer where the gate lines are located is located between a layer where the data lines are located, and the underlying substrate; and the array substrate further includes a buffer layer located between the underlying substrate and the layer where the gate lines are located; and the buffer layer includes a plurality of through-holes, where orthographical projections of the through-holes onto the underlying substrate cover orthographical projections of the areas where the gate lines intersect with the data lines, onto the underlying substrate. The through-holes are arranged at the buffer layer in the areas where the data lines intersect with the gate lines so that the foreign substances at the buffer layer in the intersection areas can be removed to thereby avoid the foreign substances from penetrating an insulation layer between the gate lines and the data lines, which would otherwise have short-circuited the gate lines with the data lines.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. An array substrate, comprising:
   an underlying substrate;
   gate lines and data lines, located on the underlying substrate and intersecting with each other; a layer where the gate lines are located being between a layer where the data lines are located and the underlying substrate;
   a buffer layer, located between the underlying substrate and the layer where the gate lines are located, and comprising a plurality of through-holes;
   filling sections, only located in the through-holes on sides of the gate lines away from the underlying substrate;

wherein orthographical projections of the through-holes onto the underlying substrate cover orthographical projections of intersection areas where the gate lines intersect with the data lines, onto the underlying substrate;

in a direction perpendicular to a plane of the underlying substrate, a thickness of each gate line in the intersection areas is smaller than a thickness of the buffer layer; and in the intersection areas, sides of the filling sections away from the underlying substrate are flush with a side of the buffer layer away from the underlying substrate.

2. A display panel, comprising the array substrate according to claim 1.

3. A display device, comprising the display panel according to claim 2.

4. The array substrate according to claim 1, further comprises:

an interlayer dielectric layer, located between the layer where the gate lines are located and the layer where the data lines are located.

5. The array substrate according to claim 4, wherein the interlayer dielectric layer comprises first grooves arranged corresponding to the through-holes, in the intersection areas, and the data lines 4 are located in the first grooves; and the orthographical projections of the through-holes onto the underlying substrate cover orthographical projections of the first grooves onto the underlying substrate.

6. The array substrate according to claim 4, wherein the interlayer dielectric layer is made of silicon dioxide, silicon nitride, a macromolecule material, or gas gel.

7. The array substrate according to claim 4, wherein areas in the array substrate other than the intersection areas comprise active layers; and in the direction perpendicular to the plane of the underlying substrate, the active layers are located between the buffer layer and the layer where the gate lines are located.

8. The array substrate according to claim 7, wherein the interlayer dielectric layer comprises second grooves arranged corresponding to the active layers; and source and drain electrodes arranged at a layer same as the layer where the data lines are located in the second grooves.

* * * * *